(12) United States Patent
Hertkorn et al.

(10) Patent No.: US 9,842,964 B2
(45) Date of Patent: *Dec. 12, 2017

(54) METHOD FOR PRODUCING A SEMICONDUCTOR LAYER SEQUENCE

(71) Applicant: OSRAM Opto Semiconductors GmbH, Regensburg (DE)

(72) Inventors: Joachim Hertkorn, Wörth an der Donau (DE); Werner Bergbauer, Windberg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/304,447

(22) PCT Filed: Apr. 15, 2015

(86) PCT No.: PCT/EP2015/058175
§ 371 (c)(1),
(2) Date: Oct. 14, 2016

(87) PCT Pub. No.: WO2015/169554
PCT Pub. Date: Nov. 12, 2015

(65) Prior Publication Data
US 2017/0047479 A1    Feb. 16, 2017

(30) Foreign Application Priority Data

May 8, 2014    (DE) .................... 10 2014 106 505

(51) Int. Cl.
*H01L 33/00*    (2010.01)
*H01L 33/12*    (2010.01)
(Continued)

(52) U.S. Cl.
CPC .............. *H01L 33/12* (2013.01); *C30B 25/04* (2013.01); *C30B 25/183* (2013.01);
(Continued)

(58) Field of Classification Search
CPC ............. H01L 21/0242; H01L 21/0243; H01L 21/02458; H01L 21/02502; H01L 21/0254;
(Continued)

(56) References Cited

U.S. PATENT DOCUMENTS 6,091,085 A    7/2000    Lester
8,129,210 B2*  3/2012    Kawashima ........... B82Y 20/00
                                                       257/E21.09
(Continued)

FOREIGN PATENT DOCUMENTS

DE         10320160 A1    8/2004
DE    102012107001 A1    2/2014
(Continued)

OTHER PUBLICATIONS

Hiramatsu, K.et al., "Selective Area Etching of GaN and AlGaN by Thermally Chemical Reaction in Hydrogran Ambient," Materials Research Society, Symposium Proceedings vol. 482, Dec. 1-5, 1997, pp. 991-996.
(Continued)

*Primary Examiner* — Savitr Mulpuri
(74) *Attorney, Agent, or Firm* — Slater Matsil, LLP

(57) ABSTRACT

A method for producing a semiconductor layer sequence is disclosed. In an embodiment the includes growing a first nitridic semiconductor layer at the growth side of a growth substrate, growing a second nitridic semiconductor layer having at least one opening on the first nitridic semiconductor layer, removing at least pail of the first nitridic semiconductor layer through the at least one opening in the second
(Continued)

nitridic semiconductor layer, growing a third nitridic semiconductor layer on the second nitridic semiconductor layer, wherein the third nitridic semiconductor layer covers the at least one opening at least in places in such a way that at least one cavity free of a semiconductor material is present between the growth substrate and a subsequent semiconductor layers and removing the growth substrate.

13 Claims, 6 Drawing Sheets

(51) Int. Cl.

| | |
|---|---|
| H01L 21/02 | (2006.01) |
| C30B 25/04 | (2006.01) |
| C30B 25/18 | (2006.01) |
| C30B 29/40 | (2006.01) |
| H01L 21/78 | (2006.01) |
| H01L 31/0304 | (2006.01) |
| H01L 31/0392 | (2006.01) |
| H01L 31/18 | (2006.01) |
| H01L 33/32 | (2010.01) |
| H01S 5/02 | (2006.01) |

(52) U.S. Cl.
CPC .......... *C30B 25/186* (2013.01); *C30B 29/403* (2013.01); *H01L 21/0242* (2013.01); *H01L 21/0243* (2013.01); *H01L 21/0254* (2013.01); *H01L 21/0265* (2013.01); *H01L 21/02458* (2013.01); *H01L 21/02502* (2013.01); *H01L 21/02639* (2013.01); *H01L 21/02642* (2013.01); *H01L 21/02647* (2013.01); *H01L 21/02664* (2013.01); *H01L 21/7813* (2013.01); *H01L 31/03048* (2013.01); *H01L 31/0392* (2013.01); *H01L 31/1852* (2013.01); *H01L 31/1856* (2013.01); *H01L 31/1892* (2013.01); *H01L 33/007* (2013.01); *H01L 33/0079* (2013.01); *H01L 33/32* (2013.01); *H01S 5/0206* (2013.01); *H01S 5/0213* (2013.01); *H01S 5/0217* (2013.01)

(58) Field of Classification Search
CPC ......... H01L 21/02639; H01L 21/02642; H01L 21/02647; H01L 21/0265; H01L 21/02664; H01L 33/007; H01L 33/0079; H01L 33/32; H01L 33/12
See application file for complete search history.

(56) References Cited

U.S. PATENT DOCUMENTS

| | | | |
|---|---|---|---|
| 8,236,672 B2 * | 8/2012 | Chinone | ............ H01L 21/0242 257/103 |
| 8,450,751 B2 | 5/2013 | Engl et al. | |
| 2001/0053618 A1 | 12/2001 | Kozaki et al. | |
| 2003/0186475 A1 | 10/2003 | Ueda et al. | |
| 2005/0173692 A1 | 8/2005 | Park et al. | |
| 2011/0266552 A1 | 11/2011 | Tu et al. | |
| 2015/0069418 A1 * | 3/2015 | Heo | ........................ H01L 33/22 257/79 |
| 2015/0187985 A1 | 7/2015 | Hertkorn et al. | |

FOREIGN PATENT DOCUMENTS

| | | |
|---|---|---|
| JP | 2012116726 A | 6/2012 |
| WO | 2013089459 A1 | 6/2013 |

OTHER PUBLICATIONS

Vartuli, C.B. et al., "Cl2/Ar and CH4/H2/Ar dry etching of III-V nitrides," Journal of Applied Physics, vol. 80, No. 7, Oct. 1, 1996, pp. 3705-3709.

* cited by examiner

METHOD FOR PRODUCING A SEMICONDUCTOR LAYER SEQUENCE

This patent application is a national phase filing under section 371 of PCT/EP2015/058175, filed Apr. 15, 2015, which claims the priority of German patent application 10 2014 106 505.0, filed May 8, 2014, each of which is incorporated herein by reference in its entirety.

TECHNICAL FIELD

The invention relates to a method for producing a semiconductor layer sequence. For example, the layer sequence may be applied in an electronic or optoelectronic semiconductor chip.

BACKGROUND

Patent document U.S. Pat. No. 6,091,085 describes a method for producing a semiconductor layer sequence as well as an optoelectronic semiconductor chip having such a semiconductor layer sequence.

SUMMARY OF THE INVENTION

Embodiments provide a method that can be performed in a particularly cost-efficient manner.

According to at least one embodiment of the method for producing a semiconductor layer sequence, the method comprises a method step in which a growth substrate is provided on a growth surface at a growth side. The growth substrate is provided for depositing semiconductor layers at the growth side on the growth surface of the growth substrate, for example epitaxially. Here, the growth substrate can be designed to be electrically conductive or electrically insulating. Furthermore, the growth substrate may be designed to be permeable for radiation, radiation reflective or radiation absorbent. The growth substrate may have a growth surface which is formed of sapphire, SiC or silicon. For example, the growth substrate may be a sapphire wafer consisting of sapphire. The growth substrate is not provided to remain in the finished optoelectronic semiconductor component. That means that the growth substrate is to be removed during the production method.

According to at least one embodiment of the method, said method comprises a method step in which a first nitridic semiconductor layer is grown at the growth side on the growth substrate. The first nitridic semiconductor layer may be directly adjacent to the growth surface of the growth substrate, for example. Furthermore, it is possible that at least one further layer, for example a buffer layer, is arranged between the growth substrate and the first nitridic semiconductor layer.

Generally, the layers and components described here and in the following may in particular be directly adjacent to one another. Furthermore, it is possible that further layers such as buffer layers are arranged in places between the layers described.

Here and in the following, the concept of a nitridic semiconductor layer relates to a mono or multilayer based upon a nitride semiconductor composite material.

As used herein, the term "based upon a nitride semiconductor composite material" means that the semiconductor layer sequence or at least a part thereof, particularly preferably at least an active zone, comprises or consists of a nitride semiconductor composite material, preferably $Al_nGa_mIn_{1-n-m}N$, with $0 \leq n \leq 1$, $0 \leq m \leq 1$ and $n+m \leq 1$. Here, there is no need for said material to be an exact composition according to the above formula. It may rather comprise one or multiple dopants as well as additional components, for example. However, for the sakes of clarity, the above formula includes only essential components of the crystal lattice (Al, Ga, In, N) even though the latter may be replaced and/or supplemented partially by small amounts of further substances.

According to at least one embodiment of the method, the method comprises a method step in which a second nitridic semiconductor layer is deposited onto the first nitridic semiconductor layer. Here, the second nitridic semiconductor layer has a composition different from that of the first nitridic semiconductor layer. The second nitridic semiconductor layer may in places be directly adjacent to the first nitridic semiconductor layer. As an alternative or in addition, it is possible that one or multiple further layers are arranged between the first nitridic semiconductor layer and the second nitridic semiconductor layer. However, in particular it is preferred that there is at least one region where the first nitridic semiconductor layer and the second nitridic semiconductor layer are directly adjacent to one another.

Here, the second nitridic semiconductor layer comprises at least one opening or at least one opening is produced in the second nitridic semiconductor layer or at least one opening arises during growth, in particular multiple openings, in the second nitridic semiconductor layer. In other words, the nitridic semiconductor layer is not a closed layer after development or production of the at least one opening, the second nitridic semiconductor layer is rather interrupted by the openings. Here, the openings preferably extend at least in places entirely through the second nitridic semiconductor layer.

Here, it is in particular possible that the second nitridic semiconductor layer comprises a plurality of spaced regions in a plane parallel to the main extension direction of the growth surface of the growth substrate, said regions not being connected by material of the second nitridic semiconductor layer. In other words the second nitridic semiconductor layer may be arranged in a plurality of isles of the material of the second nitridic semiconductor layer at the side of the first nitridic semiconductor layer facing away from the growth substrate. Particularly in the region of said isles, the material of the second nitridic semiconductor layer may in places be in direct contact with the material of the first nitridic semiconductor layer.

As an alternative or in addition, it is possible for the second nitridic semiconductor layer to be formed in a multiple connected manner in a plane parallel to the main extension direction of the growth surface of the growth substrate. The second nitridic semiconductor layer is not sub-divided into individual material isles, for example, but it comprises holes, namely openings, that extend entirely through the second nitridic semiconductor layer in a direction perpendicular to said plane and/or in a direction with a direction component perpendicular to said plane. It is possible that the first nitridic semiconductor layer is exposed in the region of said openings prior to the deposition of further layers.

Here, said openings may develop while growing the second nitridic semiconductor layer. For example, a material on which the second nitridic semiconductor material hardly grows or does not grow at all may be arranged in places between the first nitridic semiconductor layer and the second nitridic semiconductor layer. Material of the second nitridic semiconductor layer may arrange on the first nitridic semiconductor layer in places where said material is absent and the described isles of material of the second nitridic semiconductor layer may grow from there.

Furthermore, as an alternative or in addition, it is possible for the openings to develop as cracks during growth due to differences in the lattice constant between the first nitridic semiconductor layer and the second nitridic semiconductor layer.

Finally, as an alternative or in addition, it is possible that the openings are produced or enlarged by a process such as etching after finishing growth of the second nitridic semiconductor layer.

According to at least one embodiment of the method, said method comprises a method step in which at least part of the first nitridic semiconductor layer is removed through the openings in the second nitridic semiconductor layer. Due to the openings in the second nitridic semiconductor layer, it is possible that the first nitridic semiconductor layer is exposed there or can be exposed there. The openings enable removing the first nitridic semiconductor layer then, for example by means of a chemical or mechanical method, at least in places where said layer is exposed. This way, even regions below the second nitridic semiconductor layer may be produced, from which material of the first nitridic semiconductor layer, which was previously present, is removed again.

According to at least one embodiment of the method, the method comprises a method step in which a third nitridic semiconductor layer is grown onto the second nitridic semiconductor layer, the third nitridic semiconductor layer covering the openings at least in places.

The third nitridic semiconductor layer is different from, for example, the first and/or the second nitridic semiconductor layer in terms of its material. The third nitridic semiconductor layer may cover the openings in the first nitridic semiconductor layer or even fill the latter. For example, it is possible then for the third nitridic semiconductor layer to entirely cover the second nitridic semiconductor layer and the openings in the second nitridic semiconductor layer so that after the growth of a third nitridic semiconductor layer the second nitridic semiconductor layer and the openings in the second nitridic semiconductor layer can no longer be recognized in a plan view of the semiconductor layer sequence close to the surface and at a low penetration depth (e.g. scanning electron microscope SEM).

In particular, it is possible that the regions from which the material of the first nitridic semiconductor layer is removed through the openings are not filled with the material of the third nitridic semiconductor layer, i.e. cavities that are not filled with semiconductor material are present between the growth substrate and the subsequent semiconductor layers. Said cavities are filled with a gas, for example.

According to at least one embodiment of the method, the growth substrate is removed. Removal of the growth substrate may be effected mechanically, chemically and/or by means of heat introduction, e.g. by means of laser radiation. The semiconductor layer sequence produced this way is free of a growth substrate then. The cavities between the growth surface of the growth substrate and the subsequent semiconductor layers reduce the contact surface between the growth substrate and the subsequent semiconductor layers. Therefore, predetermined breaking points for the removal are already specified for removing the growth substrate particularly in the region of the first nitridic semiconductor layer.

Here, it is particularly possible that even the remaining rest of the first nitridic semiconductor layer is at least partially or entirely removed during removal of the growth substrate. In particular in a mechanical removal of the growth substrate it is possible that this is effected for the removal of the growth substrate in the region of the first nitridic semiconductor layer since the contact area between the growth substrate and the subsequent semiconductor layer is reduced due to the cavities formed. In particular in this case, a rest of the first nitridic semiconductor layer may remain on the semiconductor layer sequence produced this way.

According to at least one embodiment of the method for producing a semiconductor layer sequence, the method comprises the following steps:

providing a growth substrate having a growth surface at a growth side, growing a first nitridic semiconductor layer at the growth side, growing a second nitridic semiconductor layer onto the first nitridic semiconductor layer, wherein the second nitridic semiconductor layer has at least one opening or at least one opening is produced in the second nitridic semiconductor layer or at least one opening arises in the second nitridic semiconductor layer during growth, removing at least part of the first nitridic semiconductor layer through the openings in the second nitridic semiconductor layer, growing a third nitridic semiconductor layer onto the second nitridic semiconductor layer, wherein the third nitridic semiconductor layer covers the openings at least in places, in such a way that cavities free of a semiconductor material are present between the growth substrate and the subsequent semiconductor layers, removing the growth substrate.

The method described herein particularly allows producing a semiconductor layer sequence in which initially cavities are present between the growth substrate and the subsequent semiconductor layers, said cavities being filled with a gas, for example.

This achieves a semiconductor layer sequence in which a thermal decoupling is present in the region of the cavities between the growth surface of the growth substrate and the subsequent semiconductor layers. For example, the cavities filled with gas are less thermally conductive than the semiconductor material surrounding said cavities. If the growth substrate is removed by means of heat introduction, for example by means of laser radiation, for example, the growth substrate is thermally decoupled from the remaining semiconductor layers during removal due to the cavities. This way, the growth substrate, which contains or consists of sapphire, for example, is hardly or not at all damaged by the temperature introduction during removal. The growth substrate may therefore be re-used more than once. Furthermore, efforts for the pre-treatment of the removed growth substrate are reduced prior to the re-use. In particular, the method described herein therefore allows a particularly cost-efficient production of semiconductor layer sequences.

According to at least one embodiment of the method, the second nitridic semiconductor layer has a higher aluminum concentration than the first nitridic semiconductor layer. For example, the first nitridic semiconductor layer has an aluminum concentration of at most 10% or at most 20%. Then, the second nitridic semiconductor layer has an aluminum concentration of at least 1.5% more, in particular at least 5% more or at least 10% more than the first nitridic semiconductor layer, for example between 20% and 30%. The second nitridic semiconductor layer may even be formed or consist of AlN here, for example.

The difference in the aluminum concentration between the first nitridic semiconductor layer and the second nitridic semiconductor layer allows using a method, e.g. an etching method, for the removal of at least a part of the first nitridic semiconductor layer, for example, in which a probability of a material removal decreases along with an increased aluminum concentration. In this case the first nitridic semiconductor layer having the lower aluminum concentration will be removed more strongly by the method than the second nitridic semiconductor layer having the higher aluminum concentration.

According to at least one embodiment of the method, a mask layer is arranged between the first nitridic semiconductor layer and the second nitridic semiconductor layer prior to the deposition of the second nitridic semiconductor layer. For example, the mask layer may be directly applied to the first nitridic semiconductor layer.

For example, the mask layer is an atomically thin layer which is formed by means of a monolayer material that does not completely cover the first nitridic semiconductor material.

In a subsequent method step, the second nitridic semiconductor layer is grown onto the first nitridic semiconductor layer, with the highest probability in places where the first nitridic semiconductor layer is not covered by the mask layer. To that end, the mask layer comprises openings, for example, in which the first nitridic semiconductor layer is not covered by the mask layer. For example, the mask layer does not completely cover the first nitridic semiconductor layer, but rather with a coverage of at least 70% and 90% at the most. For the material of the mask layer, a material effecting a selectivity during growth of the second nitridic semiconductor layer is selected as the material of the mask layer, i.e. the material of the second nitridic semiconductor layer grows on the material of the mask layer in a less well manner than on the material of the first semiconductor layer, for example.

As a result, it is possible that the material of the second nitridic semiconductor layer mainly collects at the openings of the mask layer toward the first nitridic semiconductor layer where isles of the material of the second nitridic semiconductor material develop. The mask layer and the nitridic semiconductor layers can preferably be deposited epitaxially in situ.

After growing the second nitridic semiconductor layer, at least a part of the surface of the mask layer which faces away from the first nitridic semiconductor layer is free of material of the second nitridic semiconductor layer, the second nitridic semiconductor layer having at least one opening thereby. That means that a selective growth of the second nitridic semiconductor layer is generated in the region of the openings of the mask layer. Then, the second nitridic semiconductor layer comprises at least one opening between the openings of the mask layer in the second nitridic semiconductor layer.

For example, in this embodiment, a nitride semiconductor composite material having an aluminum concentration of at most 20% is selected for the first nitridic semiconductor layer. Then, a nitride semiconductor composite material having an aluminum concentration of preferably at least 1.5% more and, e.g., 10% at most more is selected for the first nitridic semiconductor layer. The aluminum concentration is between 21.5% and 30% then. Silicon nitride, SiN, may be selected for the mask layer then.

Here, the mask layer may be deposited in the same epitaxy site, i.e. in situ, as the nitridic semiconductor layers. Thus, in this embodiment, an SiN layer is deposited onto the first nitridic semiconductor layer in situ.

The SiN mask layer does not completely cover the first nitridic semiconductor layer, but at least 70% and 90% at the most, for example. After depositing the mask layer, an aluminum containing nitridic semiconductor layer, e.g. an AlGaN layer is deposited with a higher aluminum concentration than the first nitridic semiconductor layer. Isles of the second nitridic semiconductor layer develop in the openings of the mask layer then.

According to at least one embodiment of the method, the mask layer is removed prior to the removal of the part of the first nitridic semiconductor layer. Here, the mask layer can be removed by means of the same method as the first nitridic semiconductor layer. If, for example, the method is an etching method, first the mask layer can be removed, and after that the exposed first nitridic semiconductor layer. The second nitridic semiconductor layer is not removed at all or less rapid so that at least a rest of the second nitridic semiconductor layer remains.

According to at least one embodiment of the method, as an alternative or in addition, cracks may develop in the second nitridic semiconductor layer during growth of the second nitridic semiconductor layer, said cracks forming the openings in the second nitridic semiconductor layer. Here, some or all of the openings extend from the side facing away from the first nitridic semiconductor layer through the second nitridic semiconductor layer all the way to the first nitridic semiconductor layer.

For example, a high aluminum second nitridic semiconductor layer may be deposited in place of the mask layer or in addition to the mask layer. For example, said high aluminum layer may also be an AlN layer. Due to the misadjustment to the first nitridic semiconductor layer, which has a lower aluminum concentration and is formed with GaN, for example, cracks develop after a few nanometers of layer thickness of the second nitridic semiconductor layer, said cracks forming the openings in the second nitridic semiconductor layer. By means of said openings in the second nitridic semiconductor layer, the first nitridic semiconductor layer is accessible for a process gas, for example, which can be used for etching.

According to at least one embodiment of the method, removal of at least one part of the first nitridic semiconductor layer is effected by an increase of the hydrogen flow, wherein removal of the first nitridic semiconductor layer is effected due to a chemical reaction between the hydrogen and the material of the first nitridic semiconductor layer. That is, the first nitridic semiconductor layer is etched by means of the $H_2$ gas, for example. Removal can be effected in this way in the same processing chamber as growth of the nitridic semiconductor layers. Along with an increase of the hydrogen flow, it is possible at the same time to increase temperature in the processing chamber and/or to reduce nitrogen flow in the process chamber. For example, a reduction of the $NH_3$ flow may be effected to that end. These measures allow acceleration of the dissolution of the first nitridic semiconductor layer. Furthermore, materials such as $SiH_4$ or HCl may be applied.

That is, an $H_2$ enriched atmosphere is generated in the processing chamber, for example a MOVPE processing chamber, for the removal of the first nitridic semiconductor layer.

In the case that a mask layer, for exempla of SiN, is present, first the mask layer and after that first nitridic semiconductor layer is etched. Here, it is advantageous when the first nitridic semiconductor layer comprises an aluminum concentration which is less than the second nitridic semiconductor layer. In fact, a nitridic semiconductor layer is etched at a lower rate along with an increasing aluminum concentration.

The etching medium hydrogen thus undercuts the second nitridic semiconductor layer. Etching selectivity between a first nitridic semiconductor layer having a smaller aluminum concentration, which is formed with GaN or consists of GaN, and a second nitridic semiconductor layer having a greater aluminum concentration is sufficient for removing multiple hundreds if nanometers of layer thickness of the first nitridic semiconductor layer by means of etching. Here, the structures of the material of the second nitridic semiconductor layer grown prior to the removal are essentially undercut so that a modification to the second nitridic semiconductor layer can not or hardly be detected in a plan view.

After removal of a part of the first nitridic semiconductor layer, the third nitridic semiconductor layer is deposited, for example, whereby the openings and trenches in the material of the second nitridic semiconductor layer coalesce.

In the same way, gas inclusions develop below the second nitridic semiconductor layer by etching through the openings formed as cracks even in embodiments that do not include a mask layer.

According to at least one embodiment of the method, the third nitridic semiconductor layer comprises an active zone provided for the generation of radiation or for the detection of radiation, i.e. a third nitridic semiconductor layer is grown after removal of a part of the first nitridic semiconductor layer in this embodiment, which third layer may be part of an optoelectronic semiconductor component. For example, said optoelectronic semiconductor component may be a light-emitting diode, a laser diode or a photo diode. The cavities, i.e. the gas inclusions between the second nitridic semiconductor layer and the growth substrate can particularly be used in an optical manner.

According to at least one embodiment of the method, the growth substrate is removed using laser radiation. Here, the wavelength of the laser radiation is preferably selected such that the growth substrate, which contains or consists of sapphire, for example, is transparent for the laser radiation. Then, the laser radiation penetrates the growth substrates and the cavities between the growth substrate and the subsequent semiconductor layers, for example.

Then, the laser radiation is preferably largely absorbed in the second nitridic semiconductor layer sequence and/or the third nitridic semiconductor layer sequence. That is, in terms of the wavelength of the laser radiation, said laser radiation is set in such a way that a major part of the energy of the laser radiation, i.e. at least 50% of the energy of the laser radiation, is absorbed in the second and/or in the third semiconductor layer and results in a heating of the semiconductor layer there.

Preferably, a major part of the laser radiation, i.e. at least 50% of the energy of the laser radiation, is absorbed in the third semiconductor layer. To that end, the aluminum content in the second semiconductor layer may be adjusted such that the second semiconductor layer is permeable or transparent for the laser radiation. This way, it is possible that heat introduction by the laser radiation is effected at a place most distant to the growth substrate. This way, removal of the growth substrate is effected in a most smooth manner so that the growth substrate can be re-used after said removal more than twice, for example at least five times.

Advantageously, the contact surface between the growth substrate and the subsequent semiconductor layer is reduced by means of the cavities so that an overall smaller energy introduction is required for removal of the growth substrate than would be the case if the growth substrate contacts the subsequent semiconductor layers over the entire surface thereof. As an alternative or in addition to the removal of the growth substrate using laser radiation, the cavities also provide the option of removing the growth substrate chemically and/or mechanically from the subsequent semiconductor layers.

The method described herein particularly allows producing a semiconductor layer sequence for an electronic or optoelectronic semiconductor component. Here, the semiconductor component comprises a carrier, for example, which is fastened to the side of the semiconductor layer sequence facing away from the original growth substrate. Here, said carrier may be fastened on the semiconductor layer sequence prior to the removal of the growth substrate, for example. The carrier can be designed to be electrically conductive and in this case serve for contacting the semiconductor layer sequence during operation. Here, said carrier may be particularly well heat-conductive so that heat generated during operation in the semiconductor layer sequence can be dissipated via the carrier in a particularly efficient manner.

BRIEF DESCRIPTION OF THE DRAWINGS

The method described herein will hereinafter be described in greater detail by means of the exemplary embodiments and the associated Figures.

A first exemplary embodiment of a method described herein is explained in greater detail in conjunction with the FIGS. 1A, 1B, 1C, 1D, 1E.

Figure 2:
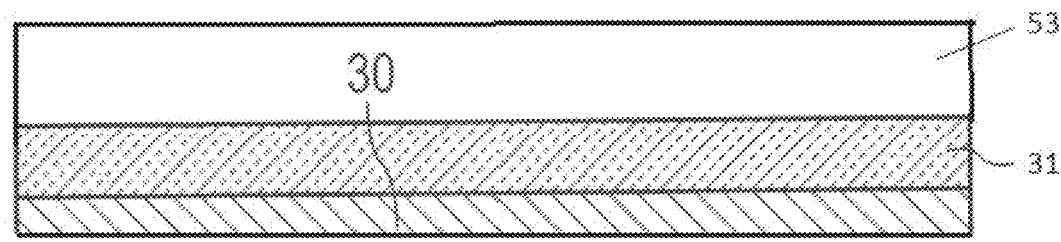

A semiconductor component is explained in greater detail in conjunction with FIG. 2 by means of a schematic sectional view, said component being produced with a method described herein.

A second exemplary embodiment of a method described herein is explained in greater detail in conjunction with FIGS. 3A, 3B, 3C, 3D.

Figure 4:
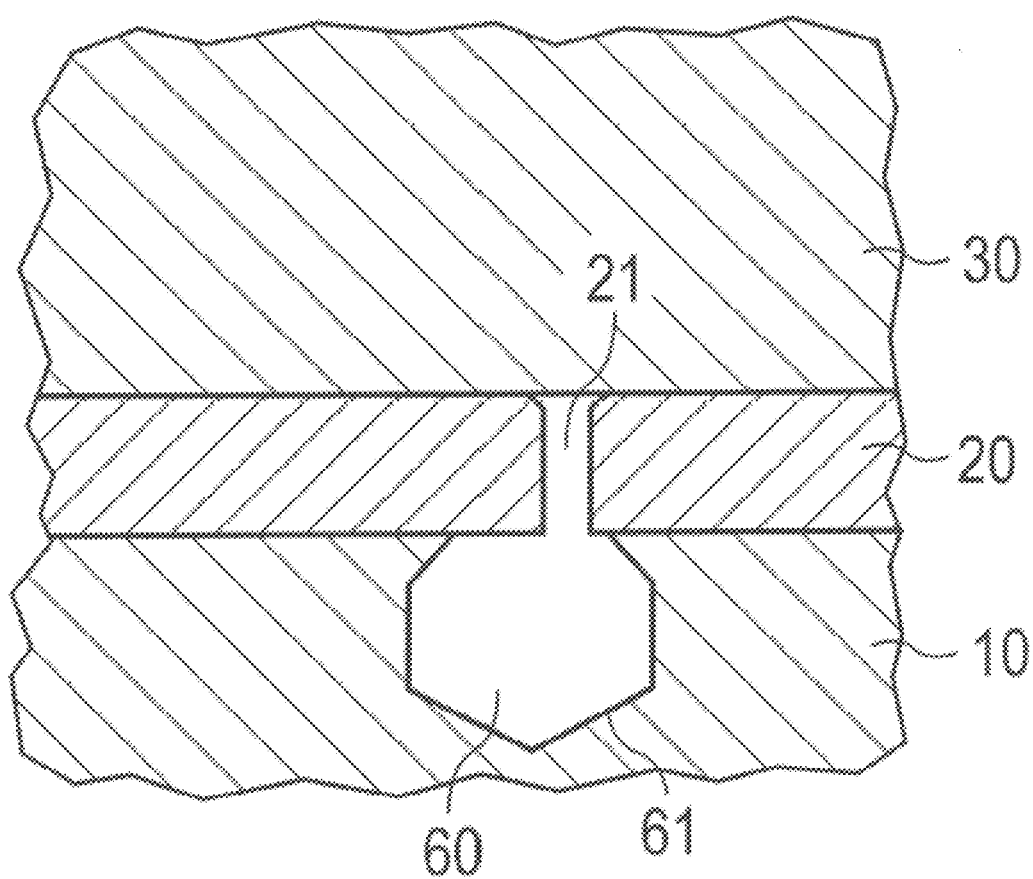

A semiconductor layer sequence is explained in greater detail in conjunction with FIG. 4 by means of a schematic sectional view, said sequence being produced with a method described herein.

Like, similar or equivalent elements are indicated with like reference numerals throughout the Figures. The Figures and the size ratios of the elements illustrated in the figures are not made to scale. The elements may rather be illustrated with an exaggerated size for a better understanding and/or for the sake of clarity.

DETAILED DESCRIPTION OF ILLUSTRATIVE EMBODIMENTS

Figure 1A:
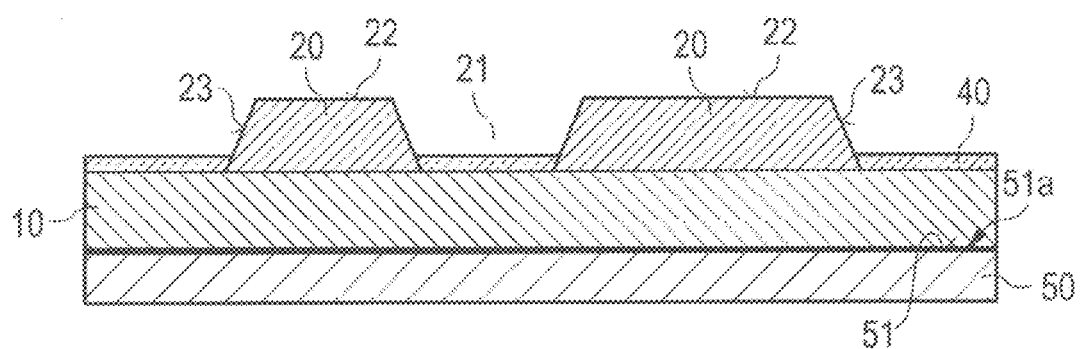

A first method step of a method described herein is explained in greater detail in conjunction with FIG. 1A by means of a schematic sectional view. In the exemplary embodiment of FIGS. 1A to 1E, first a growth substrate is provided, which is a sapphire substrate, which is formed of sapphire or which consists of sapphire.

The growth substrate 50 comprises a growth surface 51 which consists of sapphire. Preferably, the growth surface 51 is not structured, i.e. it does not have regularly or irregularly arranged elevations and depressions, for example, but is rather designed smoothly within the scope of production tolerance, wherein a roughness of up to 100 nm is possible in sub-regions. Here, the growth surface 51 is arranged at a growth side 50a of the growth substrate 50.

The first nitridic semiconductor layer 10 is directly deposited onto the growth surface 51, for example. The first nitridic semiconductor layer 10 comprises a plurality of layers and has a thickness between at least 10 nm and 2000 nm at the most, for example. The first nitridic semiconductor layer is formed of $Al_xIn_yGa_{1-x-y}N$, for example. Here, the aluminum concentration x preferably is 20% at the most.

A mask layer 40 is applied to the upper side of the first nitridic semiconductor layer 10 facing away from the growth substrate 50, said mask layer being formed with SiN and/or SiGaN or consists of SiN or of SiGaN, for example $SiGaN_3$. For example, the mask layer 50 has a thickness of at most 50 nm, particularly 10 nm at most. For example, the mask layer is formed by a monolayer material with uncovered regions. The mask layer does not entirely cover the first nitridic semiconductor layer 10, for example, but rather at least 70% and 90% at the most. To that end, the mask layer 40 comprises openings toward the first nitridic semiconductor layer, which have a diameter of at least 100 nm and woo nm at the most, for example.

In a next method step, a second nitridic semiconductor layer 20 is deposited onto the mask layer 40 and the first nitridic semiconductor layer 10.

The second nitridic semiconductor layer is formed with $Al_xGa_{1-x}N$, for example, wherein the aluminum concentration x is at least 1.5% more for example at most 10% more than in the first nitridic semiconductor layer, for example. The aluminum concentration x is at least 21.5% and 30% at most, for example. The second nitridic semiconductor layer grows selectively, preferably on the first nitridic semiconductor layer 10 and not on the mask layer 40. This way, isles of the material of the second nitridic semiconductor layer 20 develop, between which openings 21 of the second nitridic semiconductor layer 20 are formed. For example, the distance between directly adjacent isles of material of the second nitridic semiconductor layer 20 is between at least 10 nm and 500 nm at most.

The second nitridic semiconductor layer comprises a cover surface at its side facing away from the first nitridic semiconductor layer 10, the cover surface running parallel to the crystallographic C-plane, for example. The side surfaces 23 of the isles of the material of the second nitridic semiconductor layer 20 are arranged to be inclined relative to the crystallographic C plane. The aluminum concentration is lower there than at the cover surface 22.

Figure 1B:
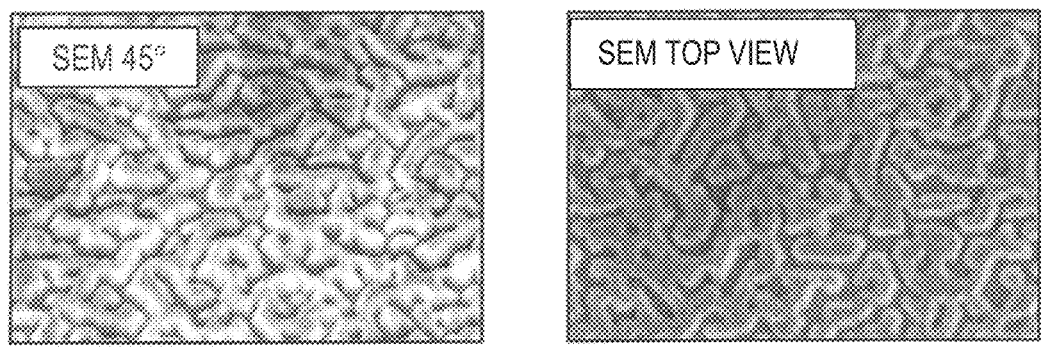

FIG. 1B shows SEM images under an angle of 45° and in the plan view of the isles of material of the second semiconductor layer 20. The mask layer 40 or the first nitridic semiconductor layer 10, respectively, can be discerned between said isles.

Figure 1C:
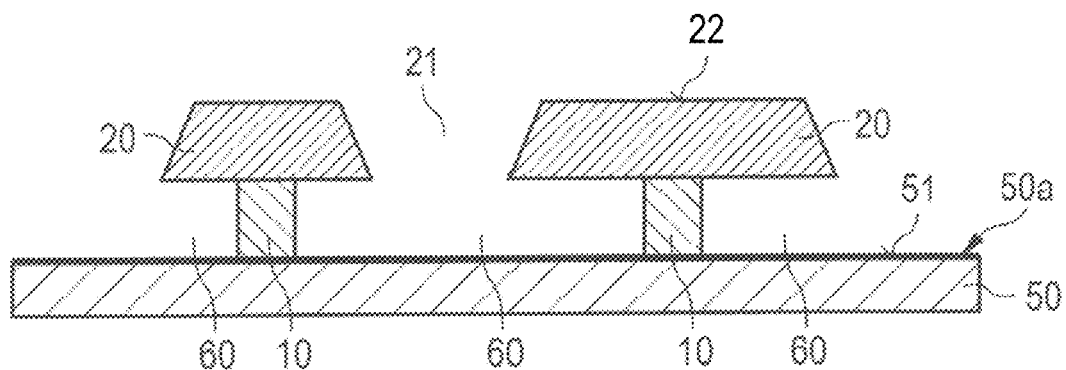

In a next method step, see FIG. 1C, the material of the first nitridic semiconductor layer 10 is re-etched under a hydrogen atmosphere. Here, the material of the first nitridic semiconductor layer 10 is removed in places, producing cavities 60 below the second nitridic semiconductor layer 20.

Figure 1D:
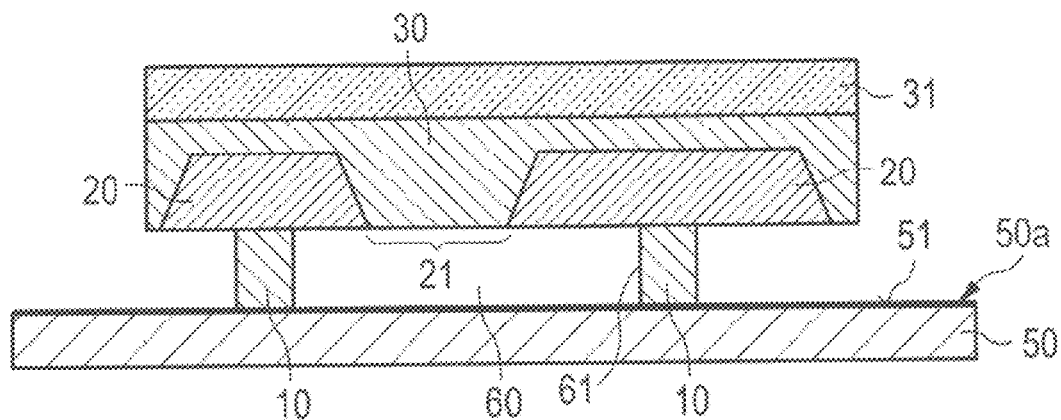

In a next method step, FIG. 1D, the third nitridic semiconductor layer 30 is applied, which includes an active zone 31, for example, which is provided for generating and/or detecting electromagnetic radiation.

As an alternative, the active zone 31 may be a functional layer of an electronic semiconductor component. This achieves a semiconductor layer sequence, in which cavities 60 are formed between the growth substrate 50 and the material of the semiconductor layers, said cavities being filled with a gas.

Figure 1E:
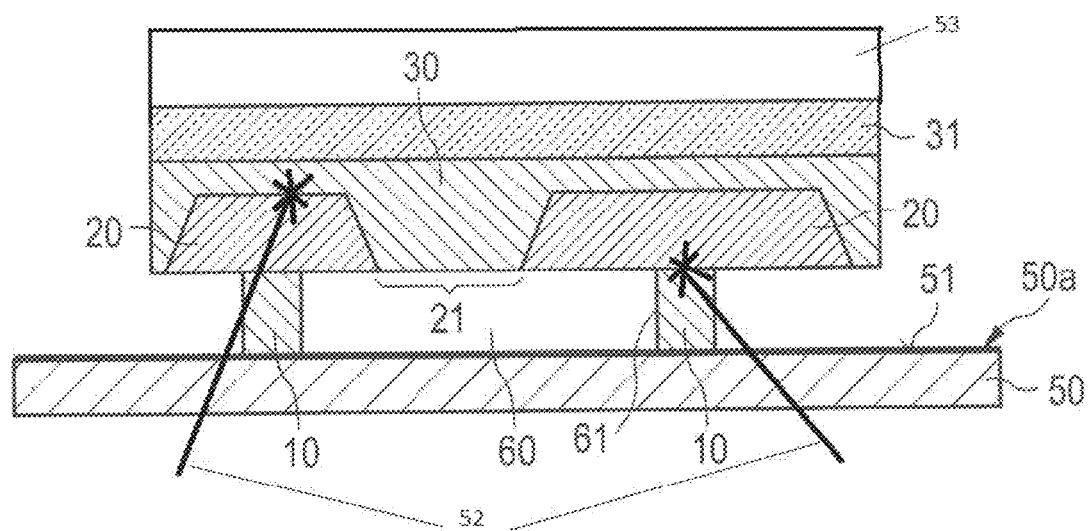

In the next method step, FIG. 1E, a carrier 53 is fastened on the side of the third nitridic semiconductor layer 30 facing away from the growth substrate 50. Said carrier may be a circuit board or a board made of an electrically conductive material such as a metal or a semiconductor material.

Subsequently, the growth substrate 50 is removed by the effects of laser radiation 52. Here, a major part of the laser radiation can be absorbed at the interface between the first nitridic semiconductor layer 10 and the second nitridic semiconductor layer 20 and/or at the interface between the second nitridic semiconductor layer 20 and the third nitridic semiconductor layer 30. The contact surface between the growth substrate 50 and the subsequent semiconductor layers is reduced due to the gas-filled cavities 60, facilitating removal of the growth substrate 50. Further, the growth substrate 50 is thermally coupled by the subsequent semiconductor layers due to the thermally poorly conductive gas-filled cavities 60. This way, the growth substrate 50 is less strongly heated while being removed than would be the case if the growth substrate 50 contacts the subsequent semiconductor layers over the entire surface. As a result, the growth substrate 50 can be removed in a particularly conservative manner. This allows the growth substrate 50 to be re-used particularly often.

A semiconductor component, for example an optoelectronic semiconductor component, which is produced by means of a method described herein, is explained in greater detail in the schematic sectional illustration in conjunction with FIG. 2. Here, the semiconductor component is a radiation generating semiconductor component, for example, in which electromagnetic radiation, e.g. light 32, is generated in the active zone 31 of the third nitridic semiconductor layer 30. The optoelectronic semiconductor component produced this way can be contacted via contacts on the carrier 53 and on the upper side of the third nitridic semiconductor layer 30 facing away from the carrier 53. Furthermore, it is possible that the optoelectronic semiconductor component comprises VIAs (not shown), which extend through the active zone 31 so that the semiconductor component can be contacted exclusively from the carrier 53, for example. Such optoelectronic semiconductor components having VIAs are described in patent specification U.S. Pat. No. 8,450,751 in a different context, the disclosure of which is incorporated herein by explicit reference.

Another exemplary embodiment of a method described herein is explained in greater detail in conjunction with the schematic sectional illustrations of the FIGS. 3A to 3D. Just as well, a growth substrate 50 with a growth surface 51 is provided at a growth side 50a in this method. For example, the growth substrate may be a sapphire substrate or a silicon substrate.

The first nitridic semiconductor layer 10 is deposited on the growth surface 50. The first nitridic semiconductor layer 10 can be formed of $Al_xIn_yGa_{1-x-y}N$, for example, wherein the aluminum concentration is 20% at the most, for example. At the side of the first nitridic semiconductor layer 10 facing away from the growth substrate 50 is followed by the second nitridic semiconductor layer 20. The second nitridic semiconductor layer 20 is formed of AlGaN or AlN, for example, and has a higher aluminum concentration than the underlying first nitridic semiconductor layer. Here, in the present exemplary embodiment, the aluminum concentration in the second nitridic semiconductor layer may even be more than 25%, in particular more than 50%, for example 100%.

Due to the difference in the lattice constants between the first nitridic semiconductor layer and the second nitridic semiconductor layer, cracks develop during relaxation of the second nitridic semiconductor layer during or after the growth of the second nitridic semiconductor layer. The second nitridic semiconductor layer 20 may have a smaller lattice constant than the first nitridic semiconductor layer 10, for example. The layer thickness of the second nitridic semiconductor layer is between at least 5 nm and at most 100 nm, for example.

Figure 3A:
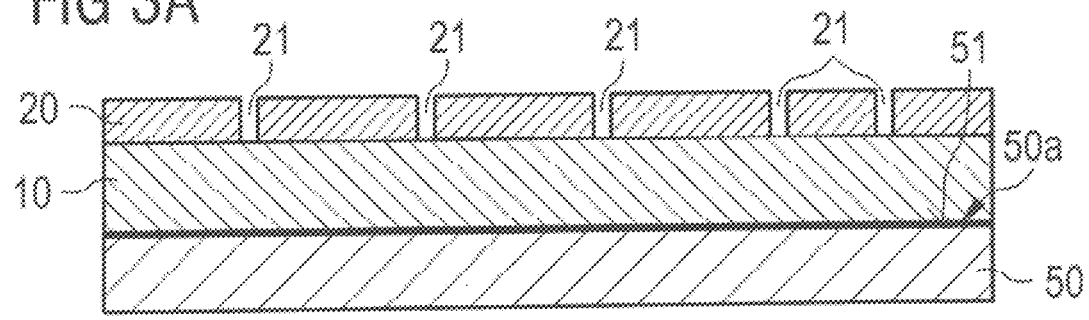
Figure 3B:
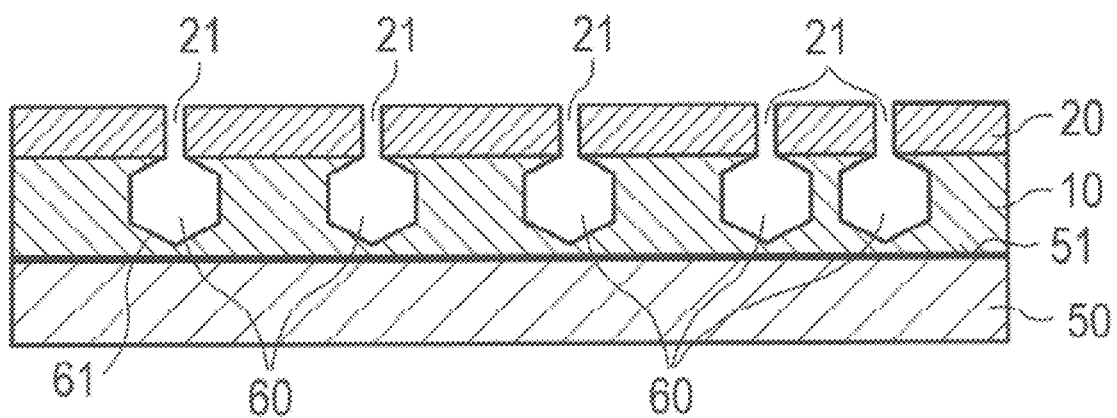

In the next method step, FIG. 3B, the underlying first nitridic semiconductor layer 10 is selectively etched through the openings 21, which are formed in the second nitridic semiconductor layer 20 through the cracks. As a result, cavities 60 develop, which are delimited by the material of the first nitridic semiconductor layer 10 and the material of the second nitridic semiconductor layer 20, for example.

Figure 3C:
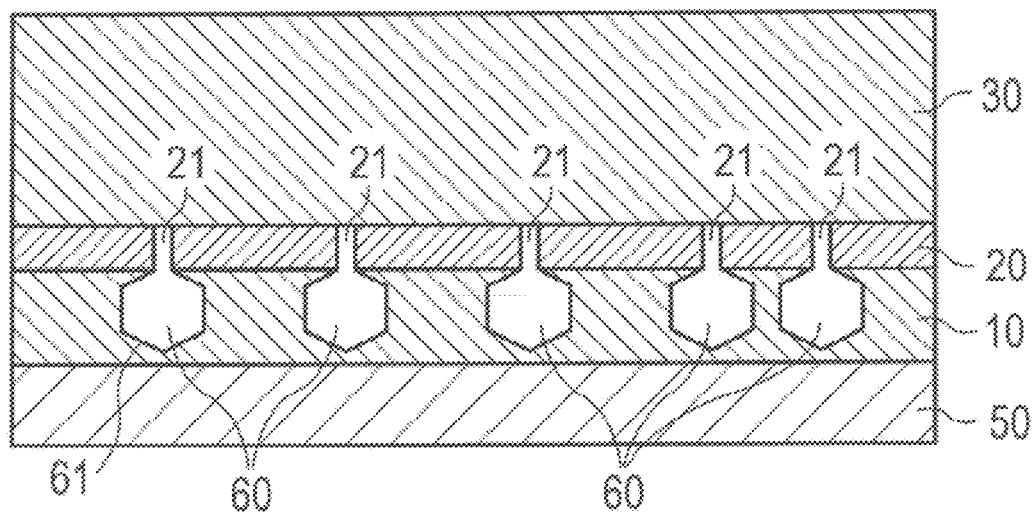

In the next method step, FIG. 3C, the third nitridic semiconductor layer 30 is deposited on the side of the second nitridic semiconductor layer 20 facing away from the first nitridic semiconductor layer 10. The third nitridic semiconductor layer 20 covers the openings 21 in the second nitridic semiconductor layer 20. The third nitridic semiconductor layer 30 is formed of AlInGaN, for example. The third nitridic semiconductor layer 30 can at least in places be structured identical to the first nitridic semiconductor layer 10. Furthermore, the third nitridic semiconductor layer 30 may comprise an active zone 31, in which electromagnetic radiation is generated or detected during operation.

Figure 3D:
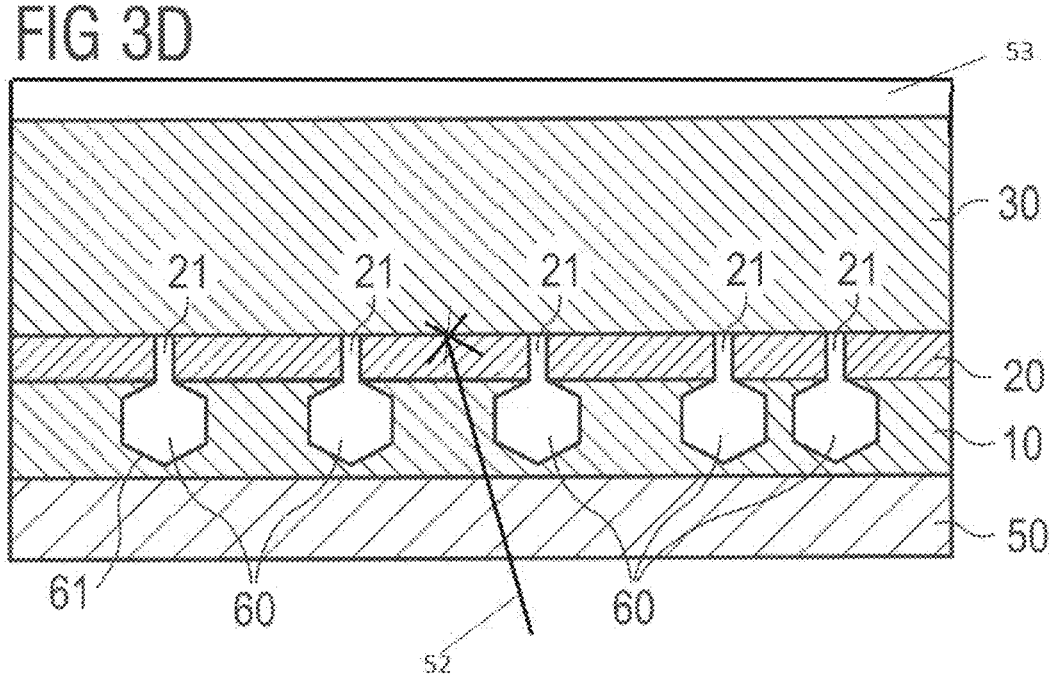

In the next method step, FIG. 3D, a carrier 53 is fastened to the side of the third nitridic semiconductor layer 30 facing away from the growth substrate 50. Said carrier may be, for example, a circuit board or a board made of an electrically conductive material such as a metal or a semiconductor material.

Subsequently, the growth substrate 50 is removed by the effects of laser radiation 52. Here, a major part of the laser radiation may be absorbed at the interface between the first nitridic semiconductor layer 10 and the second nitridic semiconductor layer 20 and/or at the interface between the second nitridic semiconductor layer 20 and the third nitridic semiconductor layer 30. The contact surface between the growth substrate 50 and the subsequent semiconductor layers is reduced due to the gas-filled cavities 60, facilitating removal of the growth substrate 50. Furthermore, the growth substrate 50 is thermally coupled by the subsequent semiconductor layers through the thermally poorly conductive, gas-filled cavities 60. This way, the growth substrate 50 is less strongly heated while being removed than would be the case if the growth substrate 50 contacts the subsequent semiconductor layers over the entire surface. The growth substrate 50 can therefore be removed in a particularly smooth manner. This allows for the growth substrate 50 to be re-used particularly often.

FIG. 4 shows a sectional view which corresponds to a TEM image of a semiconductor layer sequence produced with the method during production with a first nitridic semiconductor layer 10, a second nitridic semiconductor layer 20 and a third nitridic semiconductor layer 30. A crack in the second nitridic semiconductor layer 20 can be clearly discerned, said crack forming an opening 21 in the second nitridic semiconductor layer 20, said opening extending entirely through the second nitridic semiconductor layer 20. In the first nitridic semiconductor layer 10 the cavity 60 is produced at the end point of the crack by means of etching with hydrogen gas. Here, it is made use of the fact that the greater the etching rate, the smaller the aluminum component in the first nitridic semiconductor layer 10.

In this exemplary embodiment, the mask layer which is formed with silicon nitride, for example, is omitted, thereby preventing influence of the defect formation in the semiconductor layers, which is usually effected by the mask layer.

The density of the cavities 60 can be set by adapting the growth conditions of the second nitridic semiconductor layer 20. For example, the density of the openings 21 and thus density of the cavities 60 can be increased through an increase of time for which the material of the second nitridic semiconductor layer 20 is deposited. The size of the cavities, for example the maximum diameter thereof, can be set by the etching time, the ratio between $H_2$ and $N_2$, the amount of $NH_3$ and/or the temperature and/or the pressure in the processing chamber.

The invention is not limited by the described in conjunction with the exemplary embodiments. The invention rather comprises any new feature as well as any combination of features, particularly including any combination of features in the patent claims, even though said features of said combination is not explicitly indicated in the patent claims or exemplary embodiments per se.

The invention claimed is:

1. A method for producing a semiconductor layer sequence, the method comprising:
   providing a growth substrate having a growth surface at a growth side;
   growing a first nitride semiconductor layer at the growth side;
   growing a second nitride semiconductor layer on the first nitride semiconductor layer, wherein the second nitride semiconductor layer has at least one opening or at least one opening is produced in the second nitride semiconductor layer or at least one opening arises in the second nitride semiconductor layer during growth;
   removing at least part of the first nitride semiconductor layer through the at least one opening in the second nitride semiconductor layer;
   growing a third nitride semiconductor layer on the second nitride semiconductor layer, wherein the third nitride semiconductor layer covers the at least one opening at least in places in such a way that at least one cavity free of a semiconductor material is present between the growth substrate and a subsequent semiconductor layers; and
   removing the growth substrate.

2. The method according to claim 1, wherein the growth substrate is removed using laser radiation, and wherein the laser radiation penetrates the growth substrate and the at least one cavity and is largely absorbed in the second nitride semiconductor layer and/or in the third nitride semiconductor layer.

3. The method according to claim 1, wherein the second nitride semiconductor layer has a higher aluminum concentration than the first nitride semiconductor layer.

4. The method according to claim 1, wherein a mask layer is arranged between the first nitride semiconductor layer and the second nitride semiconductor layer, wherein the second nitride semiconductor layer is grown on the first nitride semiconductor layer in places where the first nitride semiconductor layer is uncovered by the mask layer, and wherein at least part of a surface of the mask layer, which faces away from the first nitride semiconductor layer, is free of material of the second nitride semiconductor layer, wherein the second nitride semiconductor layer has at least one opening.

5. The method according to claim 4, wherein the mask layer is removed prior to the removal of at least a part of the first nitride semiconductor layer.

6. The method according to claim 5, wherein the mask layer is removed by the same method as the first nitride semiconductor layer.

7. The method according to claim 1, wherein cracks arise in the second nitride semiconductor layer during growth of the second nitride semiconductor layer, the cracks forming multiple openings in the second nitride semiconductor layer, wherein at least some of the openings extend completely from an upper side of the second nitride semiconductor layer facing away from the first nitride semiconductor layer through the second nitride semiconductor layer all the way to the first nitride semiconductor layer.

8. The method according to claim 1, wherein the removal of at least a part of the first nitride semiconductor layer is effected by increasing a hydrogen flow and/or reducing a $NH_3$ flow, wherein the removal of the first nitride semiconductor layer is effected due to a chemical reaction between the hydrogen and a material of the first nitride semiconductor layer.

9. The method according to claim 8, wherein increasing the hydrogen flow is effected along with an increase of a temperature and/or a decrease of a nitrogen flow.

10. The method according to claim 1, wherein the third nitride semiconductor layer comprises an active zone provided for generation of radiation or for detection of radiation.

11. The method according to claim 1, wherein the growth substrate is removed using laser radiation.

12. The method according to claim 11, wherein the laser radiation penetrates the growth substrate and the at least one cavity and is largely absorbed in the second nitride semiconductor layer and/or the third nitride semiconductor layer.

13. A method for producing a semiconductor layer sequence, the method comprising:
   providing a growth substrate having a growth surface at a growth side;
   growing a first nitride semiconductor layer at the growth side;
   growing a second nitride semiconductor layer on the first nitride semiconductor layer, wherein the second nitride semiconductor layer has openings or openings are produced in the second nitride semiconductor layer or openings arises in the second nitride semiconductor layer during growth;
   removing at least part of the first nitride semiconductor layer through the openings in the second nitride semiconductor layer;
   growing a third nitride semiconductor layer on the second nitride semiconductor layer, wherein the third nitride semiconductor layer covers the openings at least in places in such a way that cavities free of a semiconductor material are present between the growth substrate and a subsequent semiconductor layers; and
   removing the growth substrate, wherein the growth substrate is removed using laser radiation, wherein the laser radiation penetrates the growth substrate and the cavities, and wherein the laser radiation is absorbed in the second nitride semiconductor layer and/or in the third nitride semiconductor layer.

* * * * *